(12) United States Patent
Harakawa et al.

(10) Patent No.: US 6,555,178 B2
(45) Date of Patent: Apr. 29, 2003

(54) PROCESS AND APPARATUS FOR NICKEL PLATING AND NICKEL-PLATED PRODUCT

(75) Inventors: Takashi Harakawa, Numazu (JP); Hideaki Nonaka, Tagata-gun (JP)

(73) Assignee: Toshiba TEC Kabushiki Kaisha, Tokyo (JP)

(*) Notice: Subject to any disclaimer, the term of this patent is extended or adjusted under 35 U.S.C. 154(b) by 70 days.

(21) Appl. No.: 09/813,989

(22) Filed: Mar. 22, 2001

(65) Prior Publication Data

US 2001/0041267 A1 Nov. 15, 2001

(30) Foreign Application Priority Data

Apr. 11, 2000 (JP) .......................... 2000-108793
Mar. 5, 2001 (JP) .......................... 2001-060254

(51) Int. Cl.[7] .............................. B05D 1/18
(52) U.S. Cl. .................... 427/443.1; 118/69; 427/398.1
(58) Field of Search ................... 427/437, 438, 427/443.1, 304, 305, 398.1, 398.2, 398.3; 118/69, 66, 67

(56) References Cited

U.S. PATENT DOCUMENTS

| 4,626,479 A | 12/1986 | Hosoi et al. |
| 4,745,004 A | * 5/1988 | Schwerin |
| 4,964,365 A | * 10/1990 | D'Amato |
| 5,711,806 A | * 1/1998 | Harnden |

FOREIGN PATENT DOCUMENTS

| EP | 0 475 567 | 3/1992 |
| EP | 0 762 814 | 3/1997 |
| JP | 8-281957 | 10/1996 |

\* cited by examiner

Primary Examiner—Brenda A. Lamb
(74) Attorney, Agent, or Firm—Oblon, Spivak, McClelland, Maier & Neustadt, P.C.

(57) ABSTRACT

According to the present invention, Ni—B is electrolessly deposited on an object and then Ni—P is electrolessly deposited on the surface of the Ni—B layer formed on the object. In this process, if any dry area is present on the Ni—B layer where moisture has been evaporated after the Ni—B depositing step and before the Ni—P depositing step, it is difficult to form a uniform Ni—P layer on the Ni—B layer in such area. Accordingly, an additional step is provided for preventing the Ni—B layer formed on the object from drying after the Ni—B plating step and before the Ni—P plating step. In this way, a uniform Ni—P layer can be electrolessly deposited on the electrolessly deposited Ni—B layer.

19 Claims, 6 Drawing Sheets

PROCESS AND APPARATUS FOR NICKEL PLATING AND NICKEL-PLATED PRODUCT

BACKGROUND OF THE INVENTION

1. Field of the Invention

The present invention relates to a process and an apparatus for nickel plating of an object such as electronic parts as well as a nickel-plated product produced by the apparatus according to the process. Particularly, the present invention relates to a technique for electrolessly plating a Ni—B layer on the surface of a substrate and then a Ni—P layer thereon.

2. Description of the Prior Art

One example of such nickel plating processes is disclosed in Japanese Patent Application Laid-Open No. 8-281957. This process involves laminating electrolessly deposited Ni—B and Ni—P layers, thereby intending to provide a nickel film which is free of membrane stress.

In this process, a pattern is formed on a ceramic substrate which is then subjected to a pretreatment by sensitizing-activation process. Next, a mask such as a resist may be stripped from the substrate which is then subjected to electroless Ni—P plating. The plating solution may comprises nickel salt (0.05–0.15 mo/l), a complexing agent, tartrate or glycin (0.075–0.225 mol/l), and a reducing agent, dimethylamine borane (0.5–4 g/l). The Ni—B plating solution further contains sodium hydrate for adjusting the pH condition of the solution within the range of 5.0–7.0. The ceramic substrate is immersed the Ni—B plating solution which has been heated to 50° C. for 20 minutes for plating Thereafter, the plated substrate is washed with pure water and subjected to electroless Ni—P plating. The Ni—P plating solution comprises nickel salt (0.05–0.15 mo/l), a completing agent, tartrate or glycin (0.075–0.225 mol/l), and a reducing agent, sodium hypophosphite (10–30 g/l). The Ni—P plating solution further contains sodium hydrate for adjusting the pH condition of the solution within the range of 5.0–7.0. The ceramic substrate is immersed in the Ni—P plating solution has been heated to 50° C. for 50 minutes to obtain a nickel layer having a thickness of about 2 $\mu$m formed on the substrate.

These conventional electroless plating processes, however, often resulted in a ceramic substrate having a thinner portions present in some areas where Ni—P has not been deposited, particularly when the substrate to be plated has a large surface or when a large number of substrates are plated at one time. This thin portions may cause quality variations among the resulting products and thus cannot provide unstressing effect as described in the Japanese Patent Application Laid-Open No. 8-281957, just partially improvement of corrosion resistance by Ni—P layer.

SUMMARY OF THE INVENTION

One object of the present invention is to provide a process for nickel plating which comprises the steps of electrolessly forming a Ni—B layer on a substrate and then a uniform and even Ni—P layer on the Ni—B layer.

Another object of the present invention is to maintain the concentration of the Ni—B plating solution deposited on the substrate in the above-described process.

These and further objects of the present invention are achieved by the novel process and apparatus for nickel-plating as well as nickel-plated product of the present invention.

One aspect of the present invention provides a nickel plating process which comprises the steps of: electrolessly plating a Ni—B layer on a substrate and then a Ni—P layer on the Ni—B plated substrate to obtain a substrate having a Ni—B layer formed on the surface thereof and a Ni—P layer superimposed on the Ni—B layer formed on the substrate. In this process, the substrate is subjected to drying-protection treatment after the Ni—B plating step and before the Ni—P plating step. In this way, a uniform and even Ni—P layer can be electrolessly plated on the electrolessly deposited Ni—B layer.

Another aspect of the present invention provides a nickel plating apparatus which comprises: a Ni—B plating bath containing a Ni—B plating solution in which a substrate is immersed for electroless Ni—B deposition; a Ni—P plating bath containing a Ni—P plating solution in which the substrate having the Ni—B layer formed thereon is immersed for electroless Ni—P deposition; and a transporting member for transporting the substrate from the Ni—B plating bath to the Ni—P plating bath; wherein the Ni—B layer formed on the substrate is prevented from drying during the transportation of the substrate from the Ni—B plating bath to the Ni—P plating bath. In this way, a uniform and even Ni—P layer can be electrolessly plated on the electrolessly deposited Ni—B layer.

Another aspect of the present invention provides a nickel plated product produced in the nickel plating apparatus according to the nickel plating process of the present invention. The nickel placed product comprises: a surface; a Ni—B layer which is electrolessly plated on the surface; and a Ni—P layer having substantially uniform thickness which is electrolessly plated on the entire surface of the Ni—B layer. Accordingly, a nickel plated product which has a Ni—B layer and a substantially uniform Ni—P layer electrolessly formed thereon can be obtained by using the nickel plating apparatus and/or process of the present invention.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, in which.

DETAILED DESCRIPTION OF THE PREFERRED EMBODIMENTS

Figure 1:
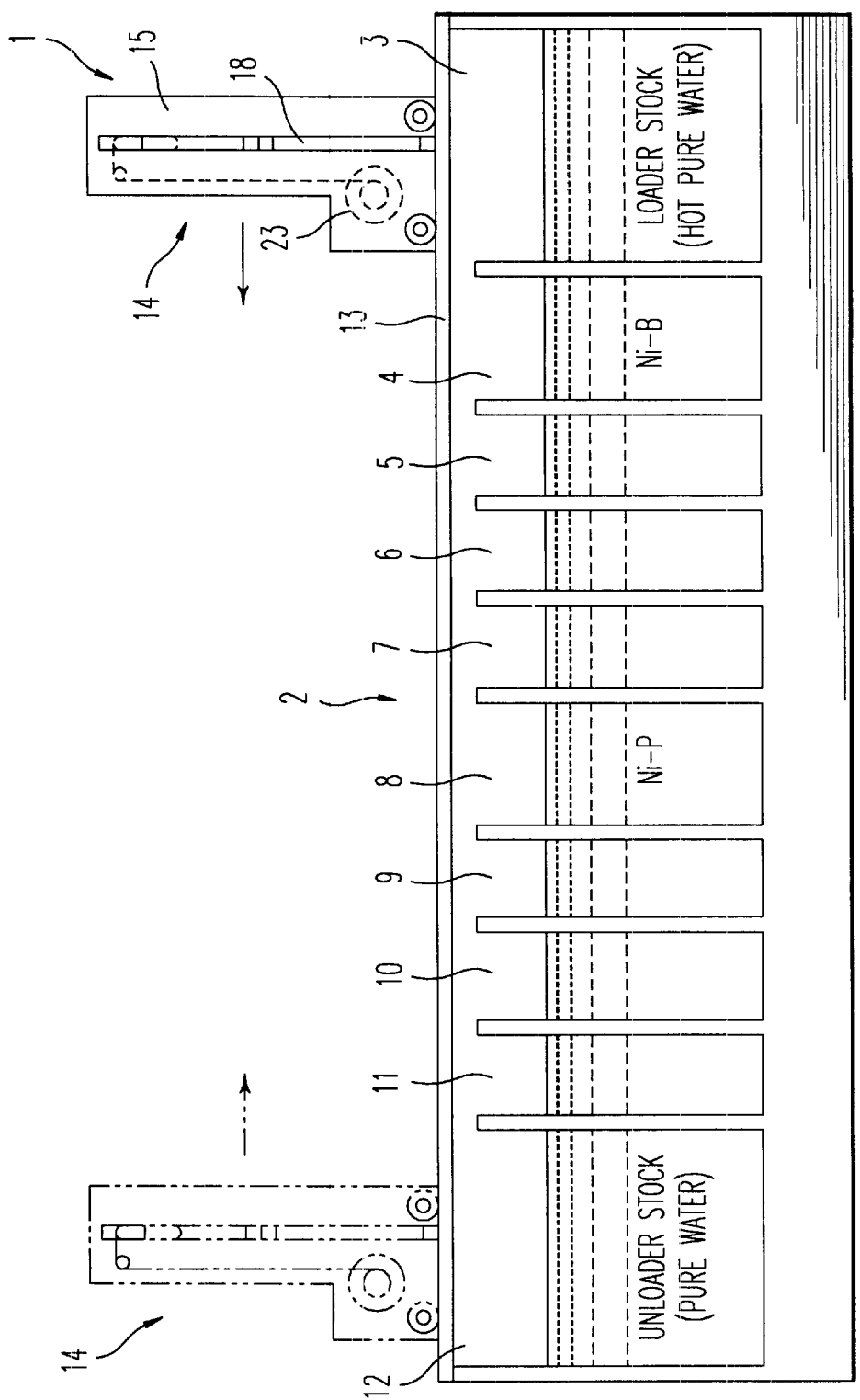
FIG. 1 is a front view of one exemplary apparatus for nickel plating according to the present invention, showing its general configuration.

The present invention will be described in reference to the following examples.

One exemplary nickel plating process of the present invention will be described. Hereinafter, the process will be described for plating a nickel layer on a ceramic substrate (particularly a PZT substrate to be used for piezoelectric element).

At first, a dry film is pasted on a ceramic substrate which has been previously washed and degreased, and then exposed for development to form a pattern such that the dry film will remain on the surface of the ceramic substrate only in the areas which are not desirable to be plated.

Next, the ceramic substrate is placed in a solution of stannous fluoride (0.01–0.5 percent by weight) in aqueous hydrofluoric acid (0.001–0.1 percent by weight) for etching the surface of the ceramic substrate while depositing Sn ions thereon. Next, the substrate is placed in a solution of palladium chloride (0.01–0.1 percent by weight) in aqueous hydrochloric acid (0.01–0.1 percent by weight) for substituting the Sn deposited on the surface of the substrate with palladium, thereby depositing palladium on the entire surface of the ceramic substrate. Then, the dry film is stripped from the substrate by using aqueous sodium hydroxide. In this way, palladium may be deposited on the ceramic substrate only in the areas where lines are to be formed. Thus, pre-treatment for plating is completed. Although not described, the ceramic substrate is washed with pure water at every interval between two subsequent steps. The above-described process is one of sensitizing-activation process. Other process including sensitizing-activation using other agents than those described herein, catalyser-accelerator process, and sputtering process for applying Pd catalyst may be useful for pretreatment.

After the above-described pretreatment step for electroless plating is completed, a laminated film comprising electrolessly plated Ni—B and Ni—P layers will be formed as described below.

Two types of plating solutions (Ni—B and Ni—P plating solutions) are prepared.

Ni—B plating solution comprises nickel salt (0.05–0.15 mo/l), a complexing agent, tartrate or glycin (0.075–0.225 mol/l), and a reducing agent, di-methylamine borane (0.5–4 g/l). Ni—B plating solution also contains sodium hydrate for adjusting the pH condition of the solution within the range of 5.0–7.0.

Ni—P plating solution comprises nickel salt (0.05–0.15 mo/l), a complexing agent, tartrate or glycin (0.075–0.225 mol/l), and a reducing agent, sodium hypophosphite (10–30 g/l). Ni—P plating solution also contains sodium hydrate for adjusting the pH condition of the solution within the range of 5.0–7.0.

At first, the Ni—B plating solution prepared as described above is adjusted to pH 6.5 at 50° C., and then used to plate the substrate for 20 minutes. Thus, Ni—B plating step is accomplished. After Ni—B plating step completed, the ceramic substrate is removed from the solution and immediately washed with water. When the ceramic substrate is plated in the solution at 50° C., for example, it may then be required to transport the substrate into the water in the washing bath from the solution within about 5 seconds.

After intense washing, the substrate is immersed in a Ni—P plating solution adjusted to pH 5.5 at 60° C. for 10 minutes. Thus, Ni—P plating step is accomplished to obtain a substrate having nickel lines of substantially uniform thickness formed thereon.

In the above-described plating process, however, there was a tendency to result in ununiform Ni—P layer if any dry area was present in the Ni—B layer after Ni—B plating step and before the next electroless Ni—P plating step. For example, a substrate was electrolessly plated with Ni—B layer, removed from the plating bath, and after 10 seconds, washed with water in a washing bath. A Ni—P layer was then formed on the substrate, which often resulted in an ununiform Ni—P layer. In summary, the present inventors found that it was difficult to form a uniform Ni—P layer on the electrolessly deposited Ni—B layer formed on the substrate if there was any dry area in the Ni—B layer where moisture is evaporated. This may be probably because a thin oxide film is formed on the surface of the Ni—B layer, which makes it difficult to deposit a Ni—P layer thereon.

Accordingly, prior to the electroless Ni—P plating step, during transportation of a ceramic substrate front the plating bath to the washing bath after the substrate is electrolessly coated with a Ni—B layer, the ceramic substrate is subjected to a treatment for preventing the electrolessly plated Ni—B layer from drying. Thus, the drying-protection step is accomplished.

For preventing the Ni—B layer from drying, the ambient atmosphere of the electrolessly plated Ni—B layer may be moistened to adjust the humidity. Alternatively, the electrolessly plated Ni—B layer may be contacted with any liquid by placing the substrate having the Ni—B layer formed thereon into the liquid or by applying or spraying the liquid onto the layer. Water may be used as the liquid though the Ni—B plating solution deposited onto the substrate may be disadvantageously diluted by the water. Therefore, Ni—B plating solution may be preferably used as the liquid.

Alternatively, the evaporation of the moisture from the surface of Ni—B plating layer may be prevented by cooling the ceramic substrate to prevent it from drying.

Hereinafter, one exemplary apparatus for nickel plating to be used in the above-described nickel plating process of the present invention will be described.

As described above, the surface of the ceramic substrate may partly become dry in several seconds after removed from the hot Ni—B plating solution though the time after removal from the plating solution and before start of the drying of the surface depends on the ambient temperature or humidity. For a big ceramic substrate or a ceramic substrate having such a shape or material property that renders the substrate more susceptible to drying, it is difficult to transport the ceramic substrate from the plating bath to the washing bath before the Ni—B layer begins to become dry.

A nickel plating apparatus 1 as shown in FIGS. 1–4 can provide a solution to these problems by carrying out the above-described nickel-plating process FIG. 1 is a font view of the nickel plating apparatus 1 showing its general configuration.

The nickel plating apparatus 1 comprises a liquid bath unit 2. The liquid bath unit 2 comprises a plurality of liquid bath sections: a loader stock 3 which contains hot pure water; Ni—B plating bath 4 which contains Ni—B electroless plating solution; washing baths 5, 6 and 7 which contain rinse water; Ni—P plating bath 8 which contains Ni—P electroless plating solution; washing baths 9, 10 and 11 which contain rinse water, and; an unloader stock 12 which contains pure water, which are serially arranged in the described order. The Ni—B plating bath 4 comprises a temperature controller for controlling the temperature of the Ni—B electroless plating solution contained therein, a vibrator for expelling bubble generated when the substrate is plated, a pH adjuster for controlling the pH range of the Ni—B electroless plating solution, an agitator for stirring the Ni—B electroless plating solution, and the like (not shown). Fresh water such as ion-exchange water is continuously supplied to the washing baths 5, 6, 7, 9, 10 and 11 by using, for example, running water. Shower baths may also be used instead of running water baths.

The liquid bath unit 2 is provided with a longitudinal guide-rail 13 parallel to the arrangement direction of the liquid baths 3–12. Caster wheels 14 are movable on the guide rail 13 in both the forward and reverse directions.

Figure 2:
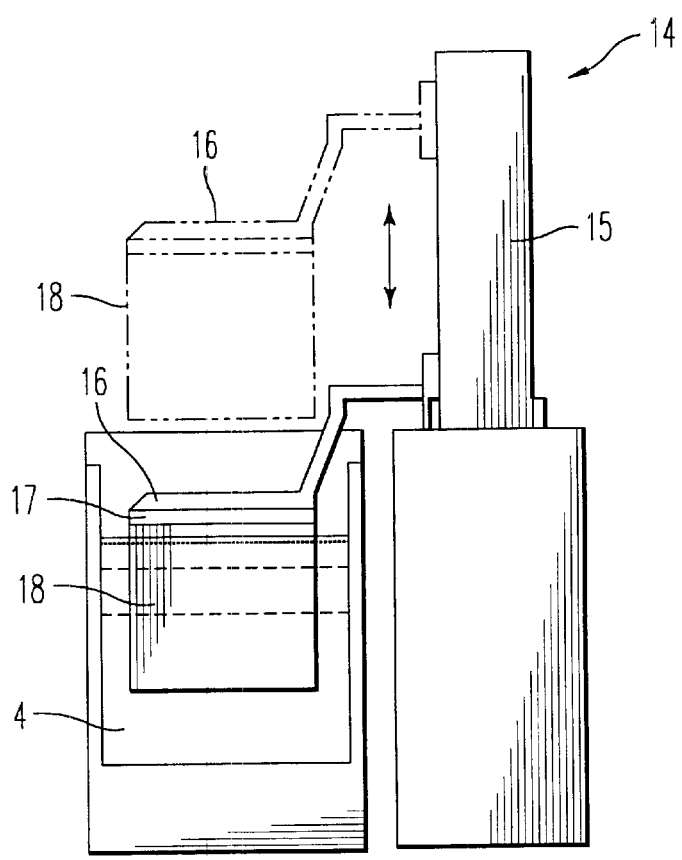
FIG. 2 is a side view of an elevating machine of the nickel plating apparatus.

As shown in FIG. 2, each of the caster wheels 14 is provided a given elevating machine 15. The elevating machine 15 lifts and lowers a carrier 16. The carrier 16 is provided with a detachable holder plate 18 via a given supporting member 17.

Figure 3:
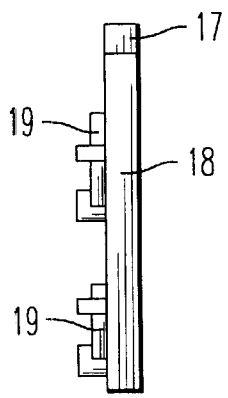
FIG. 3 is a side view of a holder of the elevating machine.

As shown in FIG. 3, a ceramic substrate 19 to be plated can be mounted onto the holder 18. The elevating machine 15 can immerse the ceramic substrate 19 in a liquid contained in selected one of the liquid bath sections 3–12 by lowering the carrier 16 at the selected bath section while it can remove the ceramic substrate 19 from the one of the liquid bath sections 3–12 by lifting the carrier 16 from the section.

Figure 4:
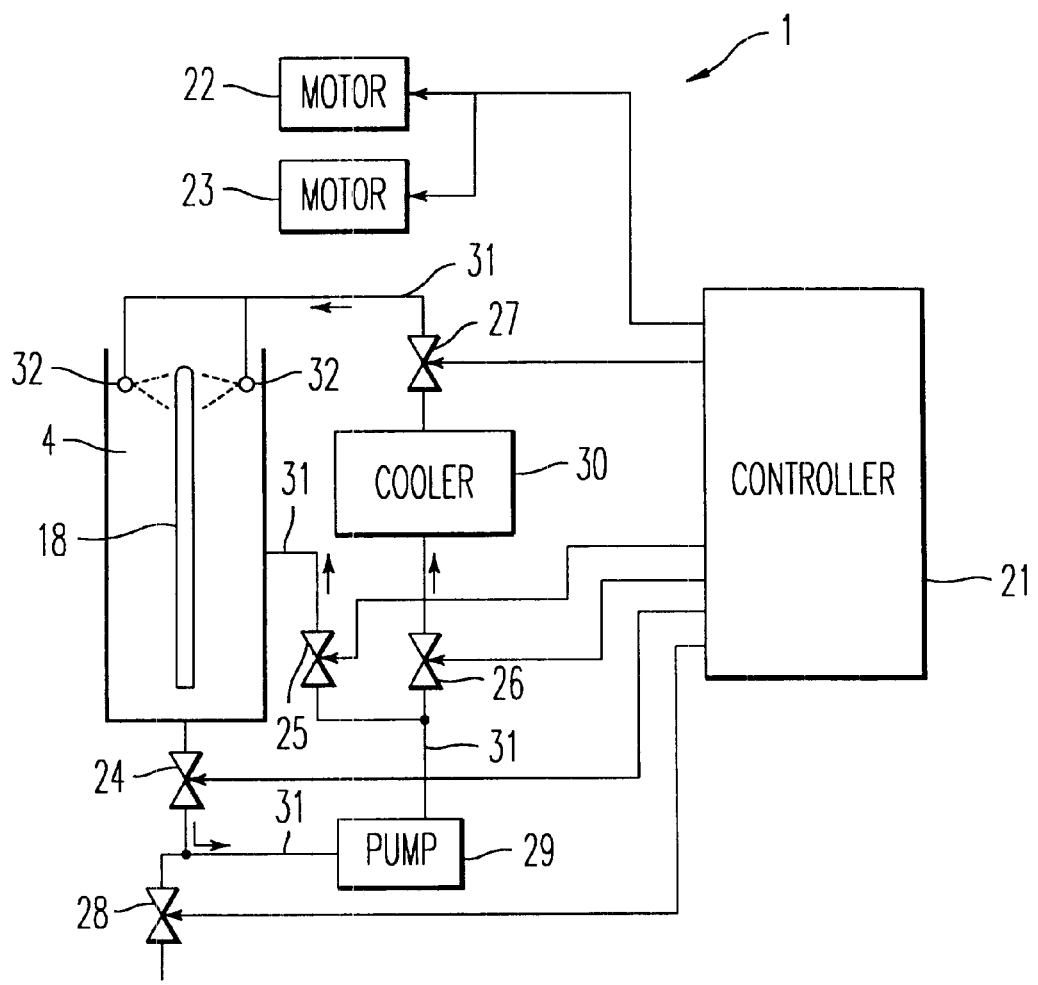
FIG. 4 is a block diagram showing a control system of a nickel plating apparatus.

As shown in FIG. 4, the nickel plating apparatus 1 includes a controller 21 which comprises micon for collectively controlling many components. To the controller 21 are connected a motor 22 for driving the caster wheels 14 on the guide-rail 13 and a motor 23 for driving the elevating machine 15. A conductor tube 31 is connected to the Ni—B plating bath 4 for introducing Ni—B electroless plating solution in the Ni—B plating bath 4. The conductor tube 31 is provided with an electromagnetic valves 24–28, a pump 29 and a cooler 30. The conductor tube 31 is arranged such that the Ni—B electroless plating solution can be introduced through the tube into the following three pathways: a first pathway for sending the Ni—B electroless plating solution back to the Ni—B plating bath 4; a second pathway for spraying the Ni—B electroless plating solution via spray nozzles 32 provided on the inner surface of the Ni—B plating bath 4 and; a third pathway for draining the Ni—B electroless plating solution from the Ni—B plating bath 4. Various actuators and/or sensors are additionally connected to the controller 21, including the temperature controller, the vibrator, the pH adjuster and the agitator which are described above.

The operation of the nickel plating apparatus 1 having the above-described configuration will be herein described. Controller 21 drives the caster wheels 14 to place the ceramic substrate 19 to be plated above selected one of the liquid bath sections 3–12, and then drives the elevating machine 15 to lower the ceramic substrate 19 to place in the liquid in the selected bath section. The caster wheels 14 and the elevating machine 15 constitute a transporting mechanism.

The ceramic substrate 19 which has been subjected to the above-described pretreatment step is then placed in a loader stock 3. Next, the substrate 19 is placed in the Ni—B electroless plating solution in the Ni—B plating bath 4 to electrolessly deposit Ni—B on the surface thereof, serially placed and washed with water in a series of the liquid bath sections 5–7, placed in the Ni—P electroless plating solution in the Ni—P plating bath 8 to electrolessly deposit Ni—P on the surface of the Ni—B layer, serially placed and washed with water in a series of the liquid bath sections 9–11, and then stored in the unloader stock 12. The time for immersion of the ceramic substrate 19 in the liquid contained in each of the liquid bath sections 3–12, and the temperature and pH conditions of the Ni—B plating bath 4 may be controlled by the controller 21.

After the ceramic substrate 19 is immersed in a Ni—B electroless plating solution in a Ni—B plating bath 4 to be electrolessly deposited with Ni—B, it is lifted out of the Ni—B plating bath 4 by the elevating machine 15, upon which the Ni—B electroless plating solution is sprayed onto the substrate 19 via spray nozzles 32. Specifically, a controller 21 opens electromagnetic valves 24, 26 and 27 and drives a pump 29 and the cooler 30 to conduct the Ni—B electroless plating solution from the Ni—B plating bath 4 through the conductors 31, cool the solution with the cooler 30 and spray the solution via the spray nozzles 32. In this way, the electrolessly deposited Ni—P layer formed on the ceramic substrate 19 may be cooled down and moistened to prevent the surface thereof from drying. Thus, the drying-protection means and the liquid emitting device are implemented with the conductors 31, the electromagnetic valves 24, 26 and 27, the pump 29, the cooler 30, the spray nozzles 32 and the like.

Instead of the Ni—B electroless plating solution, pure water may be sprayed on the ceramic substrate 19 to achieve the same effect. However, the Ni—B electroless plating solution may be preferably used since it can maintain the composition and the concentration of the Ni—B electroless plating solution deposited on the ceramic substrate 19. When pure water or the like is used, the amount of the Ni—B plating solution to be evaporated and the amount of the pure water or the like should be balanced.

By opening the electromagnetic valve 25 to circulate the Ni—B electroless plating solution and by cooling the solution with the cooler 30, the Ni—B plating solution can be kept in a constant condition for use. The electromagnetic valve 28 is used for draining the Ni—B electroless plating solution from the Ni—B plating bath 4.

Hereinafter, another exemplary nickel plating apparatus 1 will be described.

This nickel plating apparatus 1 has the same configurations as those shown in FIGS. 1 to 3. The difference of this nickel plating apparatus 1 from the above-described nickel plating apparatus 1 is that it has the structure shown in FIG. 5 instead of that shown in FIG. 4. Hereinafter, this nickel plating apparatus 1 will be described with reference to FIG. 5, where the components identical to those of the above-described nickel plating apparatus 1 will be denoted by the same reference numerals and the detailed description thereof will be omitted.

Figure 5:
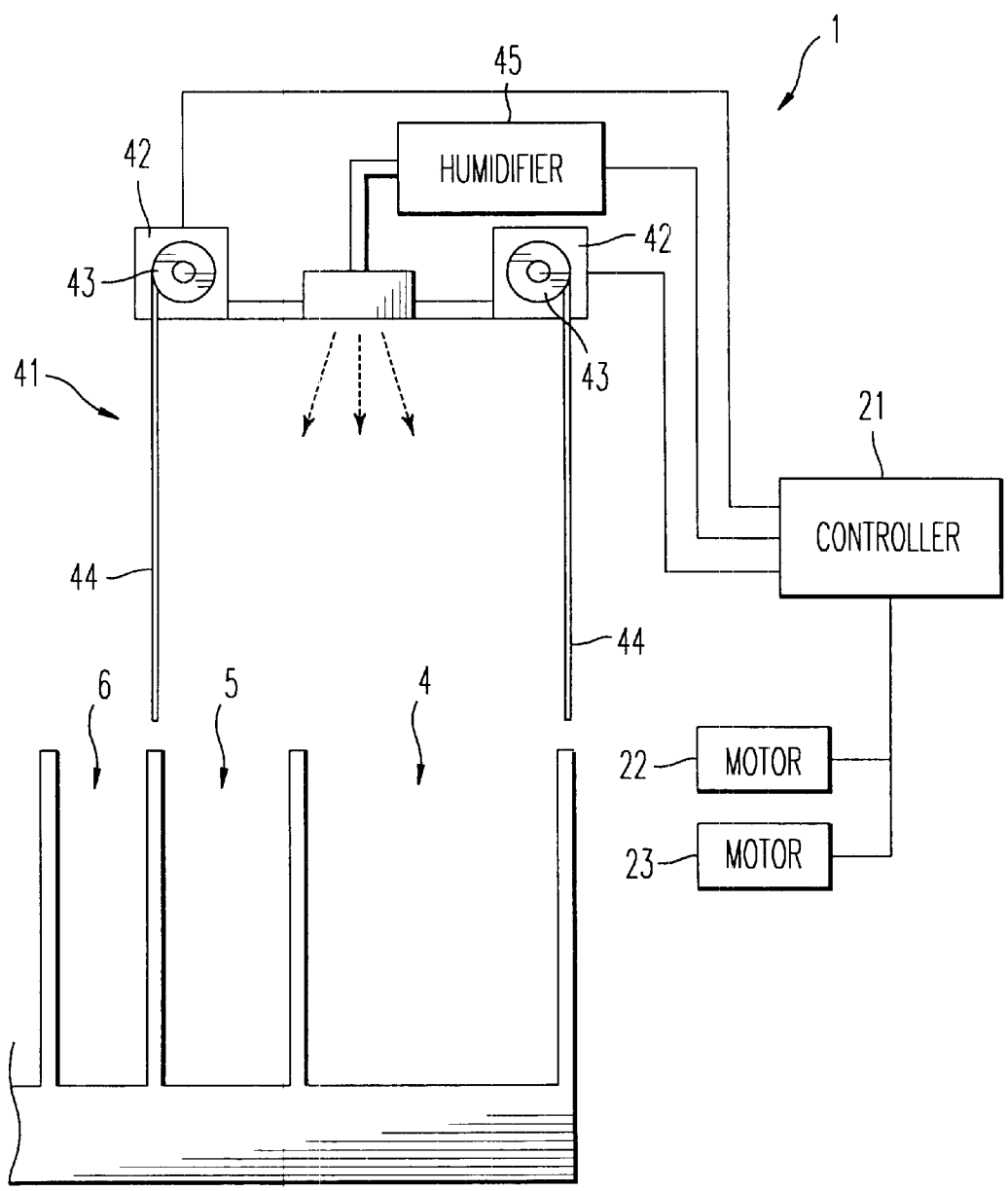
FIG. 5 is a block diagram showing a control system of the nickel plating apparatus according one example of the present invention.

As shown in FIG. 5, this nickel plating apparatus 1 is provided with a shutter unit 41 for covering the space above the Ni—B plating bath 4 and the washing bath 5, where transporting members such as a carrier 16 can pass through for transporting the ceramic substrate 19 from the Ni—B plating bath 4 to the washing bath 5. The shutter unit 41 is capable of driving winding devices 43, 43 via motors 42, 42 to open and close the shutters 44 and 44. The shutter unit 41 is also connected to a humidifier 45 (a drying-protection means) to introduce steam into the space surrounded by the shutters 44, 44. The motors 42, 42 and the humidifier 45 are connected to a controller 21. Although the shutter unit 41 is illustrated to cover only the space above the Ni—B plating bath 4 and the washing bath 5, it may also cover all or part of the other liquid baths 6 to 12.

In such a nickel plating apparatus 1, the humidity inside the shutter unit 41 is regulated by the humidifier 45. The ceramic substrate 19 deposited with the Ni—B electroless plating solution is lifted to be positioned into the space inside the shutter unit 41 where humidity is at 80% or higher with respect to the saturated vapor pressure. By maintaining the high humidity of the atmosphere inside the shutter unit 41, evaporation rate of the moisture in the Ni—B layer deposited on the ceramic substrate 19 can be decreased. As a result, even when a large-sized ceramic substrate 19 is used or when multiple substrates are processed at once, the surface(s) of the substrates can be prevented from drying and thus a stable Ni—B/Ni—P laminated film can be formed.

Hereinafter, still another example of nickel plating apparatus 1 will be described.

Figure 6:
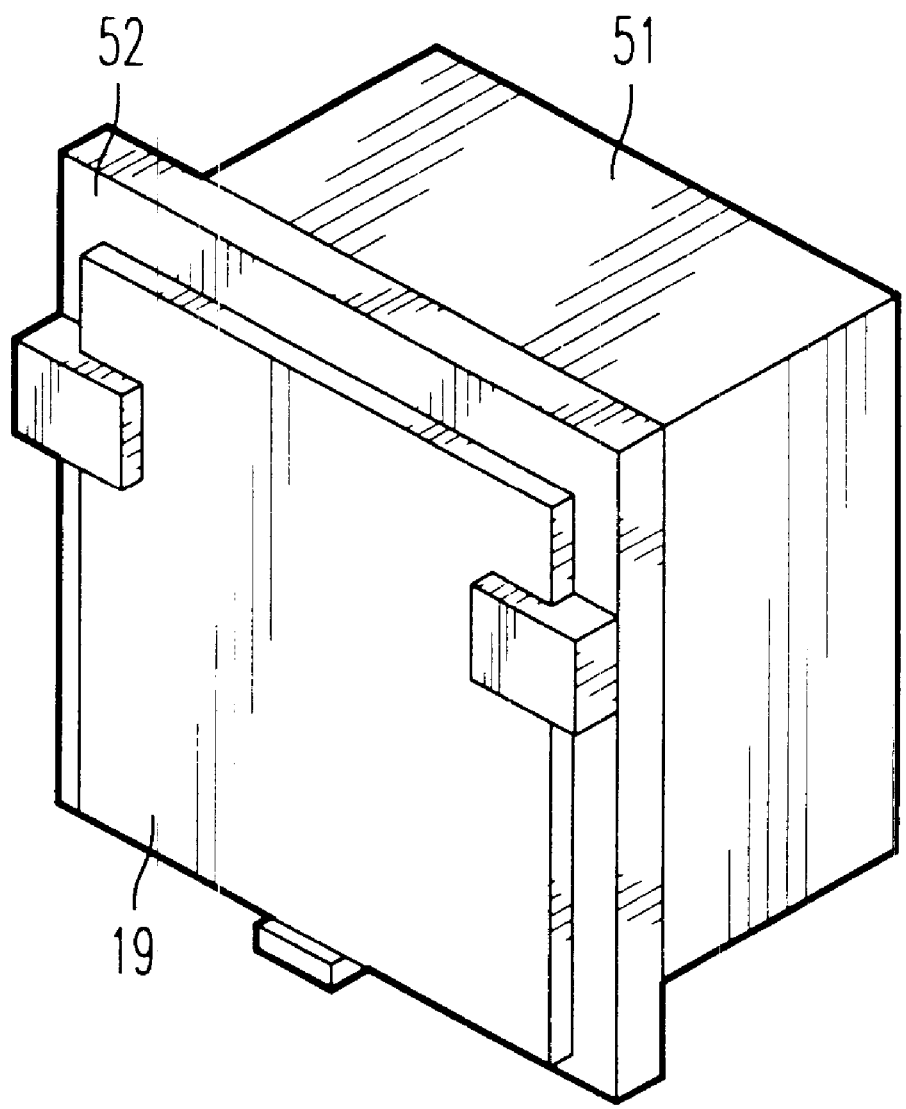
FIG. 6 is a perspective view of a jig of the nickel plating apparatus according to one example of the present invention.

This nickel plating apparatus 1 is provided with a plurality of jigs 52 for holding the ceramic substrate 19 as shown in FIG. 6, which are mounted onto the holder 18. A Peltier element 51 that serves as a drying-protection means and as a cooler is provided on the backside surface of each of the jigs 52. The Peltier element 51 is connected to the controller 21. Preferably, a predetermined heat sink is provided on the backside surface of the Pettier element 51, and the Peltier element 51 and the holder 18 are coated with Teflon. Other components of this nickel plating apparatus 1 are identical to those of the above-described nickel plating apparatuses 1 described with reference to FIGS. 1 to 4. Hereinafter, structures identical to those of the above-described nickel plating apparatuses 1 will be denoted by the same reference numerals and the detailed description thereof will be omitted.

In such a nickel plating apparatus 1, the controller 21 turns on electricity to the Peltier element 51 to cool the jig 52 and thus the ceramic substrate 19 before plated. Then, the ceramic substrate 19 is lifted out from a Ni—B plating bath 4. By cooling the ceramic substrate 19 as described above, evaporation of the Ni—B layer is prevented, thereby preventing the surface of the ceramic substrate 19 from drying after the Ni—B deposition.

Accordingly, when a two-layered electrolessly deposited Ni—B/Ni—P film is formed in any of the above-described nickel plating apparatuses 1, a stable layered film can be formed by forming a Ni—B layer and then a Ni—P on the Ni—B layer while keeping the moisture on the surface of the Ni—B layer before the subsequent wasting step thereby completely preventing the surface of the Ni—B layer from drying.

Figure 7:
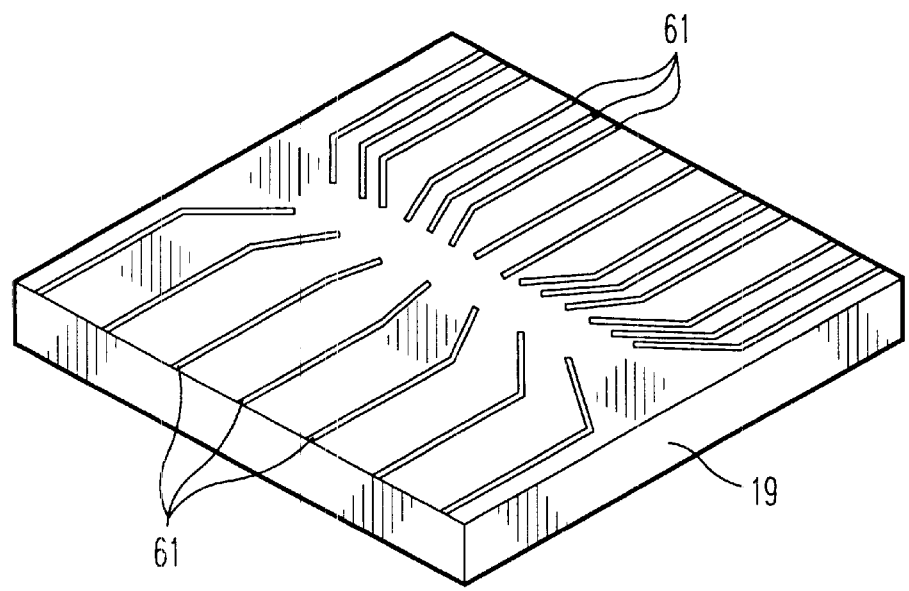
FIG. 7 is a perspective view of a ceramic substrate having a nickel layer which has been formed thereon according one example of the nickel plating process of the present invention.
Figure 8:
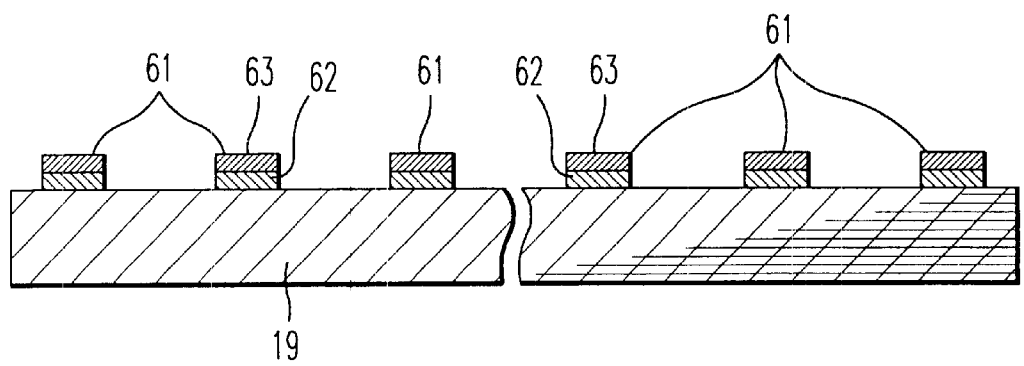
FIG. 8 is a longitudinal sectional view of the ceramic substrate.

FIG. 7 is a perspective view of the ceramic substrate 19 having nickel layer plated on the surface thereof which can be obtained according to any of the above-described production processes. FIG. 8 is a longitudinal cross-sectional view of the plate.

As shown in FIGS. 7 and 8, lines 61 are formed by nickel deposition on the surface of the ceramic substrate 19 according to any of the above-described production processes. Specifically, the lines 61 are formed by electrolessly depositing a Ni—B layer 62 on the surface of the ceramic substrate 19, followed by electrolessly depositing a Ni—P layer 63 on the Ni—B layer 62. Since the lines 61 are formed by the above-described production process, there is no deterioration of the surface of the electrolessly deposited Ni—B layer 62, and thus the thickness of the electrolessly deposited Ni—P deposited layer 63 is substantially uniform across the entire surface.

According to the above-described production processes, the surface of the electrolessly deposited Ni—B layer 62 can be prevented from deterioration, and the electrolessly deposited Ni—P layer 63 can thus be maintained substantially uniform such that the variation of the thickness of the layer 63 is within ±10%. On the other hand, for a product obtained according any of conventional processes, which were unable to prevent the surface of an electrolessly deposited Ni—B layer 62 from deterioration, the variation of the thickness of an electrolessly deposited Ni—P layer 63 was as high as ±40%.

Thus, the present invention can provide a high-quality ceramic substrate 19 which has a substantially uniform electrolessly deposited Ni—P layer 63.

The present invention may be embodied in other specific forms without departing from the spirit or essential characteristics thereof. The present embodiment is therefore to be considered in all respects as illustrative and not restrictive, the scope of the present invention being indicated by the appended claims rather than by the foregoing description and all changes which come within the meaning and range of equivalency of the claims are therefore intended to be embraced therein.

The present application is based on Japanese Priority Documents 2000-108793 filed on Apr. 11, 2000 and 2001-060254 filed on Mar. 5, 2001, the content of which are incorporated herein by reference.

What is claimed is:

1. An apparatus for nickel plating, comprising:
a Ni—B plating bath containing a Ni—B plating solution in which a substrate is immersed for electroless Ni—B deposition; a Ni—P plating bath containing a Ni—P plating solution in which the substrate having the Ni—B layer formed thereon is immersed for electroless Ni—P deposition;
a transporting member for transporting the substrate from the Ni—B plating bath to the Ni—P plating bath; and
a drying-protection means for preventing drying of the Ni—B layer formed on the substrate during the transportation of the substrate from the Ni—B plating bath to the Ni—P plating bath,
wherein the drying-protection means comprises a cooler for cooling the Ni—B layer.

2. A process for nickel plating using the apparatus as claimed in claim 1, comprising the steps of:
electrolessly plating a Ni—B layer on a substrate;
subjecting the plated substrate to a drying-protection treatment using the drying-protection means as claimed in claim 1 for preventing the Ni—B layer formed on the substrate from drying; and then,
electrolessly plating a Ni—P layer on the Ni—B layer formed on the substrate.

3. The apparatus according to claim 1, wherein the drying-protection means further comprises a humidifier for moistening the ambient atmosphere of the Ni—B layer.

4. The apparatus according to claim 1, wherein the drying-protection means further comprises a liquid-ejecting means for ejecting a predetermined liquid onto the Ni—B layer.

5. The apparatus according to claim 4, wherein the predetermined liquid is a Ni—B electroless plating solution which can be used for electroless Ni—B plating.

6. The apparatus according to claim 1, wherein the Ni—B plating solution comprises nickel salt, a complexing agent, and a reducing agent.

7. The apparatus according to claim 1, wherein the Ni—B plating solution comprises a nickel salt in an amount of 0.05 to 0.15 mol/l.

8. The apparatus according to claim 1, wherein the Ni—B plating solution comprises a complexing agent in an amount of 0.075 to 0.225 mol/l.

9. The apparatus according to claim 1, wherein the Ni—B plating solution comprises a reducing agent in an amount of 0.5 to 4 g/l.

10. The apparatus according to claim 1, wherein the Ni—B plating solution comprises a complexing agent selected from the group consisting of tartrate and glycin.

11. The apparatus according to claim 1, wherein wherein the Ni—B plating solution comprises dimethylamine borane.

12. The apparatus according to claim 1, wherein the Ni—B plating solution has a pH of 5.0 to 7.0.

13. The apparatus according to claim 1, wherein the Ni—P plating solution comprises nickel salt, a complexing agent, and a reducing agent.

14. The apparatus according to claim 1, wherein the Ni—P plating solution comprises a nickel salt in an amount of 0.05 to 0.15 mol/l.

15. The apparatus according to claim 1, wherein the Ni—P plating solution comprises a complexing agent in an amount of 0.075 to 0.225 mol/l.

16. The apparatus according to claim 1, wherein the Ni—P plating solution comprises a reducing agent in an amount of 10 to 30 g/l.

17. The apparatus according to claim 1, wherein the Ni—P plating solution comprises a complexing agent selected from the group consisting of tartrate and glycin.

18. The apparatus according to claim 1, wherein the Ni—P plating solution comprises sodium hypophosphite.

19. The apparatus according to claim 1, wherein the Ni—P plating solution has a pH of 5.0 to 7.0.

* * * * *